United States Patent
Saint-Laurent et al.

(10) Patent No.: US 7,992,062 B2
(45) Date of Patent: Aug. 2, 2011

(54) LOGIC DEVICE AND METHOD SUPPORTING SCAN TEST

(75) Inventors: Martin Saint-Laurent, Austin, TX (US); Paul Bassett, Austin, TX (US); Prayag Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 318 days.

(21) Appl. No.: 11/473,219

(22) Filed: Jun. 22, 2006

(65) Prior Publication Data

US 2007/0300108 A1    Dec. 27, 2007

(51) Int. Cl.
*G01R 31/28* (2006.01)

(52) U.S. Cl. ......................... 714/726; 714/731

(58) Field of Classification Search .................. 714/727, 714/726, 724
See application file for complete search history.

(56) References Cited

U.S. PATENT DOCUMENTS

| | | | |
|---|---|---|---|
| 5,130,645 A | | 7/1992 | Levy |
| 5,220,217 A | * | 6/1993 | Scarra et al. .................. 327/296 |
| 5,619,511 A | * | 4/1997 | Sugisawa et al. ............. 714/726 |
| 5,850,150 A | * | 12/1998 | Mitra et al. ..................... 326/16 |
| 6,380,780 B1 | * | 4/2002 | Aitken et al. .................. 327/202 |
| 6,446,229 B1 | * | 9/2002 | Merrick et al. ............... 714/724 |
| 6,742,151 B2 | * | 5/2004 | Park et al. ..................... 714/729 |
| 7,165,006 B2 | * | 1/2007 | Dhong et al. ................. 702/120 |
| 2002/0087930 A1 | | 7/2002 | Kanba | |

FOREIGN PATENT DOCUMENTS

CN           1702968         11/2005

OTHER PUBLICATIONS

International Preliminary Report on Patentability-PCT/US07/071450, The International Bureau of WIPO, Geneva Switzerland-Dec. 22, 2008.
International Search Report-PCT/US07/071450, International Search Authority-European Patent Office-Dec. 3, 2007.
Written Opinion-PCT/US07/071450, International Search Authority-European Patent Office-Dec. 3, 2007.

\* cited by examiner

*Primary Examiner* — Jeffrey A Gaffin
*Assistant Examiner* — Daniel F McMahon
(74) *Attorney, Agent, or Firm* — Peter M. Kamarchik

(57) ABSTRACT

A logic device includes a data input, a scan test input, a clock demultiplexer, and a master latch. The clock demultiplexer is responsive to a clock input to selectively provide a first clock output and a second clock output. The master latch is coupled to the data input and to the scan test input and includes an output. The master latch is responsive to the first clock output of the clock demultiplexer and the second clock output of the clock demultiplexer to selectively couple the data input or the scan test input to the output.

29 Claims, 5 Drawing Sheets

LOGIC DEVICE AND METHOD SUPPORTING SCAN TEST

BACKGROUND

I. Field

The present disclosure generally relates to systems and methods of scan testing.

II. Description of Related Art

Generally, an integrated circuit may include multiple digital logic circuits. One type of digital logic circuit is a flip-flop, which is a circuit that can be switched between two states. Flip-flop circuits are a common type of sequential circuit element used to build digital systems. Accordingly, flip-flop circuits may have an impact on both power and performance for such systems.

Modern integrated circuits usually incorporate a variety of design-for-test (DFT) structures to enhance their inherent testability. Typically, the DFT structures are based on a scan design, where scan test data is provided to a test pin or where a plurality of externally accessible scan chains are embedded into the integrated circuit. When the scan chain is embedded, the scan chain may include one or more scan cells coupled in series, with each scan cell including a flip-flop or a latch. Typically, scan test design is used in conjunction with fault simulation and combinational ATPG (automatic test pattern generation) to generate manufacturing and diagnostic test patterns for production test and prototype debug processes.

To provide DFT functionality, a circuit may have a test input, which can be accessed during a testing mode and which may be tied to a logic level during normal non-test operation. Test logic, such as a multiplexer, may be introduced to select between modes and to provide a data pattern to a logic circuit to be tested by passing the data pattern through the chain. The resulting output of the logic circuit provides an indication of faults present in the logic circuit.

To test a logic circuit, the test logic provides test data to an input of the logic circuit. Unfortunately, to provide the data to the input, the test logic, such as a multiplexer, is typically placed within the data path of the logic circuit and may unnecessarily consume power during normal non-test operation. Moreover, such test logic may introduce delays in the data path of the logic circuit, and the delays tend to reduce the performance of the logic circuit.

Other sequential technologies, including pulsed latches, have been used to reduce delay. While pulsed latches may reduce the delay in the data path of the logic circuit, pulsed latches tend to consume more power and are typically less robust than flip-flops.

Accordingly, it would be advantageous to provide a logic circuit with an improved test logic that reduces power loss and delays while maintaining DFT compatibility.

SUMMARY

In a particular embodiment, a logic device is provided that includes a data input, a scan test input, a clock demultiplexer, and a master latch. The clock demultiplexer is responsive to a clock input to selectively provide a first clock output and a second clock output. The master latch is coupled to the data input and to the scan test input and includes an output. The master latch is responsive to the first clock output of the clock demultiplexer and the second clock output of the clock demultiplexer to selectively couple the data input or the scan test input to the output.

In another particular illustrative embodiment, a method of operation of a digital logic device is provided that includes receiving a mode selection input to select between a test mode and an operating mode and selectively generating a first clock or a second clock based on the mode selection input. The method further includes routing a data input to a first state node of a storage element in response to the first clock, where the storage element includes a second state node that is inverted with respect to the first state node. Additionally, the method includes selectively isolating a scan test input from the second state node of the data latch element based on the mode selection input.

In still another particular illustrative embodiment, a logic device includes a clock demultiplexer, a master latch, a slave latch, and a logic gate. The clock demultiplexer is coupled to a clock input and is responsive to a mode selection input to selectively generate a first clock or a second clock. The master latch is coupled to a data input and a scan test input and includes an output. The master latch is responsive to the first clock to couple the data input to the output and is responsive to the second clock to couple the scan test input to the output. The slave latch is coupled to the output of the master latch and is responsive to the clock input to selectively couple the output of the master latch to a data output. The logic gate is coupled to the data output and is responsive to the mode selection input to selectively couple the data output to a scan test output.

One particular advantage provided by embodiments of the particular logic device is that the test logic is removed from the data path of the logic device, reducing delays in the data path. In one particular embodiment, the delays may be reduced by up to 25 percent.

Another advantage is provided in that the logic device may consume less power than a conventional logic device with design for testability (DFT) features in the critical data path. Since the test logic is removed from the data path, the scan test logic may be gated in a power-off state during non-test operation. In one particular embodiment, the logic device may consume approximately 27 percent less power than a conventional logic device.

Still another advantage is that the test logic and the logic device are approximately the same physical size and may occupy approximately the same amount of area on a circuit substrate as conventional devices with DFT features.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
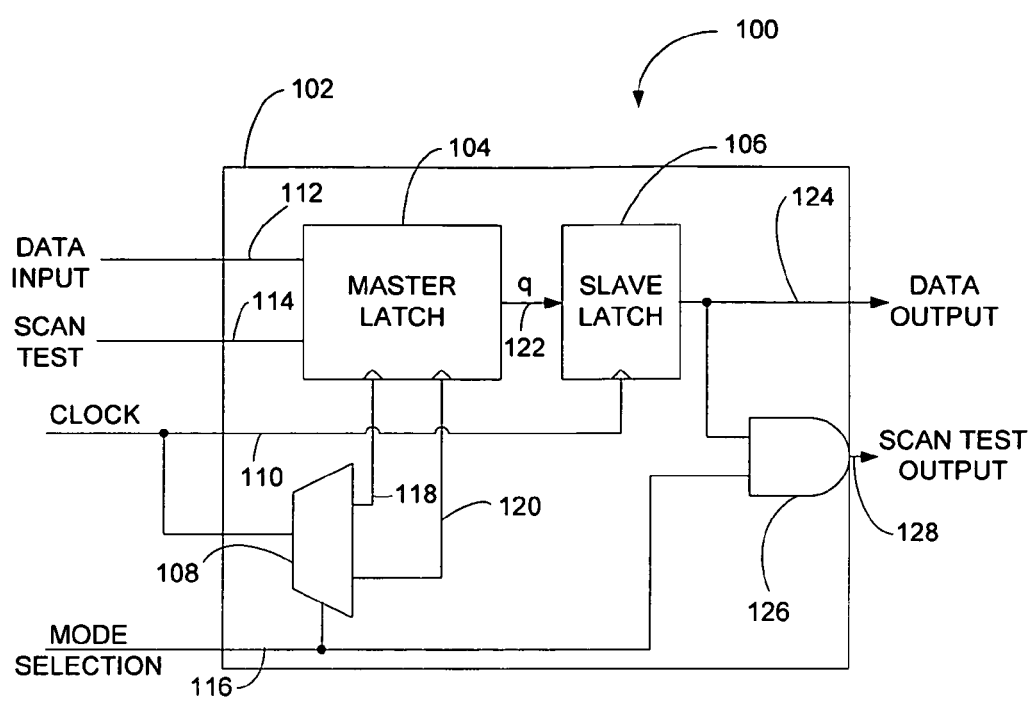
FIG. 1 is a block diagram illustrating a particular embodiment of a device with design for testability (DFT) compatible test logic.

FIG. 1 is a block diagram of a logic device 100 with design for testability (DFT) compatible test logic. The logic device 100 includes an integrated circuit 102 that includes a master latch 104, a slave latch 106, and a clock demultiplexer 108. The integrated circuit 102 includes a clock input 110, a data input 112, a scan test input 114, and a mode selection input 116. The clock demultiplexer 108 receives the clock input 110 and a mode selection input 116. The clock demultiplexer 108 is responsive to the clock input 108 to selectively provide a first clock output 118 and a second clock output 120. The master latch 104 is coupled to the data input 112 and to the scan test input 114. The master latch 104 also includes an output 122. The master latch 104 is responsive to the first clock output 118 of the clock demultiplexer 108 and the second clock output 120 of the clock demultiplexer 108 to selectively couple the data input 112 or the scan test input 114 to the output 122. In one particular embodiment, the mode selection input 116 is coupled to the clock demultiplexer 108 to selectively activate the first clock input 118 or the second clock input 120 based on the clock input 110.

The slave latch 106 is coupled to the output 122 of the master latch 104 to couple the output 122 of the master latch 104 to the data output 124. A logic gate 126 is coupled to the data output 124 and is responsive to an input, such as the mode selection input 116, to selectively couple the data output 124 to a scan test output 128 or to prevent a scan test output 128 from toggling. In a particular embodiment, the mode selection input 116 includes a test scan mode or an operating mode, and the output 122 of the master latch 104 is coupled through the slave latch 106 to the scan test output 128 when the mode selection input 116 indicates the test scan mode and is coupled through the slave latch 106 to the data output 124 when the mode selection input 116 indicates the operating mode.

In a particular embodiment, the master latch 104 includes a data storage element that is selectively coupled to the data input 112 and to the scan test input 114. The data storage element may include a pair of cross-coupled inverters. In one particular embodiment, the master latch 104 may include a memory element and test scan circuitry to receive the scan test input 114 and to selectively couple the scan test input 114 to the memory element. In another particular embodiment, the master latch 104 includes a memory element and a transmission gate to receive the data input 112 and to selectively couple the data input 112 to the memory element. In still another embodiment, the master latch 104 includes a memory element including a pair of cross-coupled inverters and a write circuit, such as a transmission gate.

In operation, the clock demultiplexer 108 receives the clock input 110 and generates the first clock output 118 or the second clock output 120 according to the mode selection input 116. In one particular embodiment, when the first mode selection is received via the mode selection input 116, the clock demultiplexer 108 produces the first clock output 118, triggering the master latch 104 to provide data from the data input 112 to the output 122. The slave latch 106 provides data on the output 122 to the output 124 responsive to the clock input 110. In another particular embodiment, when the second mode selection is received via the mode selection input, the clock demultiplexer 108 produces the second clock output 120, triggering the master latch 104 to provide scan test data from the scan test input 114 to the output 122. The slave latch 106 provides data on the output 122 to the output 124 responsive to the clock input 110. The logic gate 126 provides the scan test data from the output 124 to the scan test output 128 responsive to the mode selection input 116. In one particular embodiment, when the second mode selection is received via the mode selection input 116, the scan test output 128 is related to the scan test input 114.

In one particular embodiment, a time delay from the data input 112 to the data output 124 during a first mode of operation is less than a time delay from the scan test input 114 to the scan test output 128 during a second mode of operation.

In one particular embodiment, the master latch 104 includes scan test circuitry that is gated in a power off state when the logic device 100 is in a non-test mode of operation. The scan test circuitry does not introduce a delay to a data path responsive to the data input 112.

Figure 2:
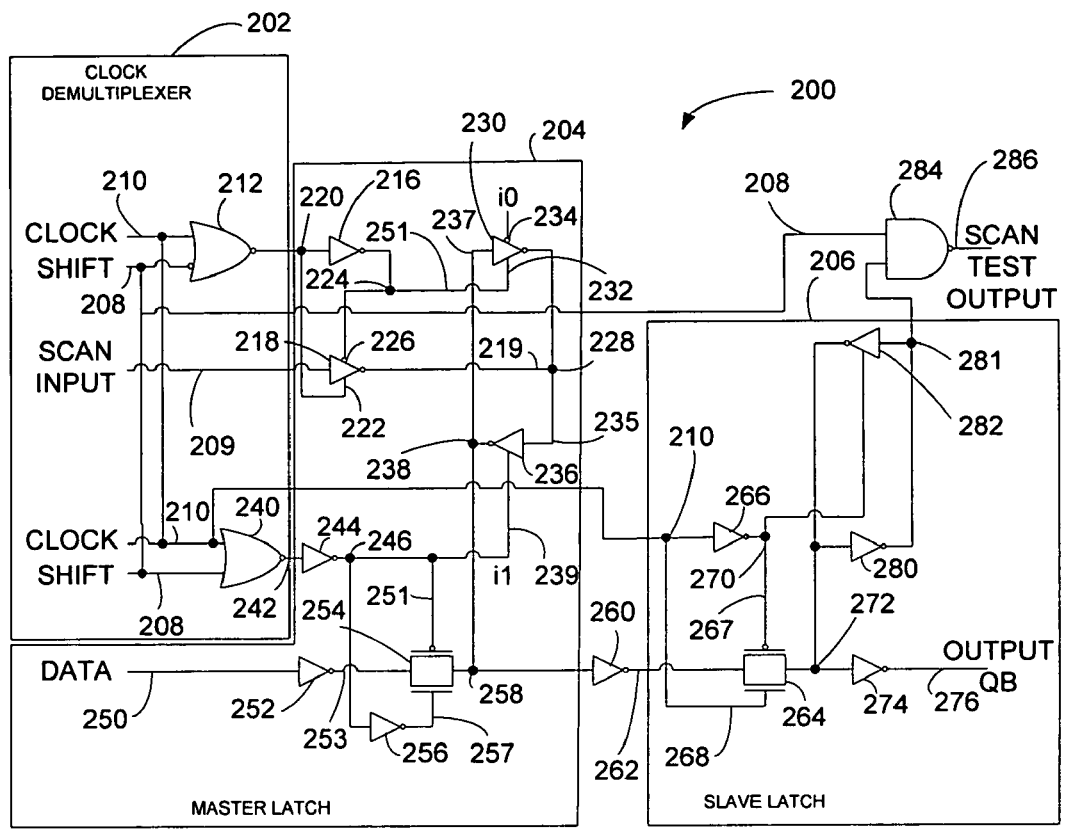
FIG. 2 is a schematic diagram illustrating a particular embodiment of a digital logic circuit with design for testability (DFT) features separated from an operational data path.

FIG. 2 is a schematic diagram illustrating a particular illustrative embodiment of a logic circuit 200 with design for testability (DFT) features separated from an operational data path. The logic circuit 200 includes clock demultiplexing logic 202, a master latch 204, a slave latch 206, and scan test output logic 284. The clock demultiplexing logic 202 includes a shift input 208, a clock input 210, and NOR gates 212 and 240. The NOR gate 212 inverts the shift input 208. The NOR gates 212 and 240 operate to demultiplex the clock input 210 responsive to the shift input 208. When the shift input 208 is at a logic low level, the NOR 212 provides a zero output, while the NOR gate 240 proves a clock signal that is inverted relative to the clock input 210. Thus, the NOR gates 212 and 240 provide clock demultiplexing logic 202 that converts a clock input 210 into a first clock signal at output 242 and a second clock signal at node 220.

The inverter 216 inverts the logic level at node 220 and provides an inverted output to node 224. The tri-state inverter 218 includes an input coupled to a scan test input 209, an input coupled to node 220, and an inverted input coupled to the node 224. The shift input 208 controls the tri-state inverter 218 to selectively couple the scan test input 209 to a second state node 228 of the master latch 204. When the shift input 208 is at a logic low, the tri-state inverter 218 is deactivated, thereby isolating the second state node 228 from the scan test input 209. When the shift input 208 is at a logic high level, then the NOR gate 212 receives the shift input 208 as a logic low signal, since the shift input 208 of the NOR gate 212 is inverted, and the output of the NOR gate 212 at node 220 is an inverted version of the clock input 210.

The NOR gate 240 includes the shift input 208 and the clock input 210. When the shift input 208 is at a logic low, the NOR gate 240 outputs an inverted version of the clock input 210 at output 242. The output 242 is coupled to an inverter 244, which is coupled to a node 246.

The master latch 204 includes a data input 250, a scan test input 209, a tri-state inverter 230, a tri-state inverter 236, inverters 252 and 256, and a transmission gate 254. The scan test input 209 is coupled to the tri-state inverter 218 and to node 228. The tri-state inverter 230 includes a scan test clock input 232 coupled to the node 224, an inverted input 234 to receive an activation signal (i0), an input 237 coupled to a first state node 238, and an output coupled to the second state node 228. The tri-state inverter 236 includes an input 235 that is coupled to the second state node 228, a clock input 239 that is coupled to the node 246 to receive an activation signal (i1), and an output coupled to the first state node 238. It should be understood that the arrangement of the tri-state inverters 230 and 236 may be referred to as a storage element or as a cross-coupled inverter, which can be controlled by the logic level of the shift input 208. The master latch 204 also includes the inverter 252 to receive the data input 250 and to provide an inverted version of the data input 250 to the transmission gate 254. The transmission gate 254 may be a write circuit that is controlled by the clock input 210, such as a tristate inverter. The transmission gate 254 includes an input to receive the inverted version of the data input 250, inputs 251 and 257 to provide inverted versions of the clock input to the transmission gate 254, and an output coupled to the first state node 238 via node 258. In general, the storage element of the tri-state inverters 230 and 236 and the transmission gate 254 form a latch means or latch element. It should be apparent to someone skilled in the art that the number of logic gates between the clock and transmission gate 254 can be varied to change the timing characteristics of the circuit. The number of logic gates on the clock path of tristate inverter 226 can also be varied for the same reason.

The slave latch 206 is coupled to the first state node 238 via node 258 and via an inverter 260. The slave latch 206 includes an input 262 that is coupled to an output of the inverter 260. The slave latch 206 also includes a transmission gate 264, inverters 266, 274, and 280, and a tri-state inverter 282. The inverter 266 includes a clock input 210 and provides an output to a node 270. The transmission gate 264 includes an input coupled to the output 262 of the inverter 260, an input 268 coupled to the clock input 210, and an input 267 coupled to the node 270. The transmission gate 264 includes an output coupled to node 272 and to a data output 276 via inverter 274. The inverter 280 includes an input coupled to the node 272 and an output coupled to the node 281. The inverter 282 includes an input coupled to the node 281, a control input coupled to the node 270, and an output coupled to the node 272. The slave latch 206 latches the data from the node 258 to the output 276 of the slave latch 206 on each clock cycle.

The NAND gate 284 includes an input coupled to the shift input 208, an input coupled to the node 281, and a scan test output 286. When the shift input 208 is at a logic low level, the output of the NAND gate 284 is held at a logic high level. When the shift input 208 is at a logic low level, the NAND gate 284 provides an inverted version of the scan test input 209 to the scan test output 286. Thus, when the scan test mode of operation is selected, such as by placing a logic high signal on the shift input 208, the data from the output 276 is gated onto the scan test output 286 by the NAND gate 284. The same gating function can also be implemented using a different type of logic gate, such as a NOR gate.

In one particular embodiment, when in a functional or operating mode, the tri-state inverter 218 that is coupled to the scan test input 209 is disabled when the shift input 208 receives a shift value of zero (or a logic low value, such as a level that is below a threshold voltage level, for example). The output of the NOR gate 240 is inverted by inverter 244 and inverted again at the control inputs 251 and 257 of the transmission gate 254, which is enabled to pass data from the data input 250 to the first state node 258. During an operating mode, the scan circuitry may be gated off to conserve power. The data input 250 is coupled to the data output 276 via the transmission gates 254 and 264 and via inverters 252, 258 and 274 to provide a data output signal on the data output 276 that is related to the data input signal at the data input 250. The scan test logic is not part of this data path.

In a test mode, the shift value is "1" (a logic high, such as a level that is above a threshold voltage level, for example) at the shift input 208, the tri-state inverter 218 is enabled and the scan test input 209 is connected to the second state node 228 via the tri-state inverter 218. Concurrently, the transmission gate 254 is disabled to disconnect the data input 250 from the first state node 258. The scan circuitry 204 becomes the master latch that is coupled to the first state node 258, which provides the input to the slave latch 206. In the test mode, the scan test input 209 is coupled to the scan output 286 via the tri-state inverter 218, the node 228, the cross-coupled inverters 230 and 236, the first state node 258, the inverter 260, the transmission gate 264, the inverter 280, the tri-state inverter 282, the node 281, and the NAND gate 284.

The circuit 200 performs like a multiplexer followed by a flip-flop. However, the scan test circuitry is removed from the data path logic. Instead, the multiplexing is performed using the clock input 210 and the shift input 208 in the clock demultiplexing logic 202 to produce two clocks to the master latch 204 to selectively couple either the scan test input 209 or the data input 250 to the slave latch 206. Additionally, the scan circuitry does not slow down the data flow through the data path logic.

In general, a microprocessor that is designed for mobile applications may include flip-flops, which may account for approximately 29% of the total dynamic power consumption of the microprocessor. A flip-flop circuit that incorporates the scan test logic described in FIGS. 1 and 2, for example, may be approximately 25% faster and may require 27% less power than conventional flip-flops, while occupying the same physical area on the chip. The flip-flop, such as the inverters 280 and 282 in the slave latch 206 and the inverters 234 and 236 of the master latch 204 has its scan logic removed from the data path during normal operation. Additionally, since flip-flops are widely utilized in digital systems, the circuit 200 maintains design for testability (DFT) compatible test logic while removing the DFT scan circuitry from the data path logic to reduce delays relative to conventional scan test logic disposed within the data path. It should be understood that the term "data path logic" as used herein refers to the data path utilized during operating mode, as opposed to the scan test data path utilized during a test mode of operation.

Figure 3:
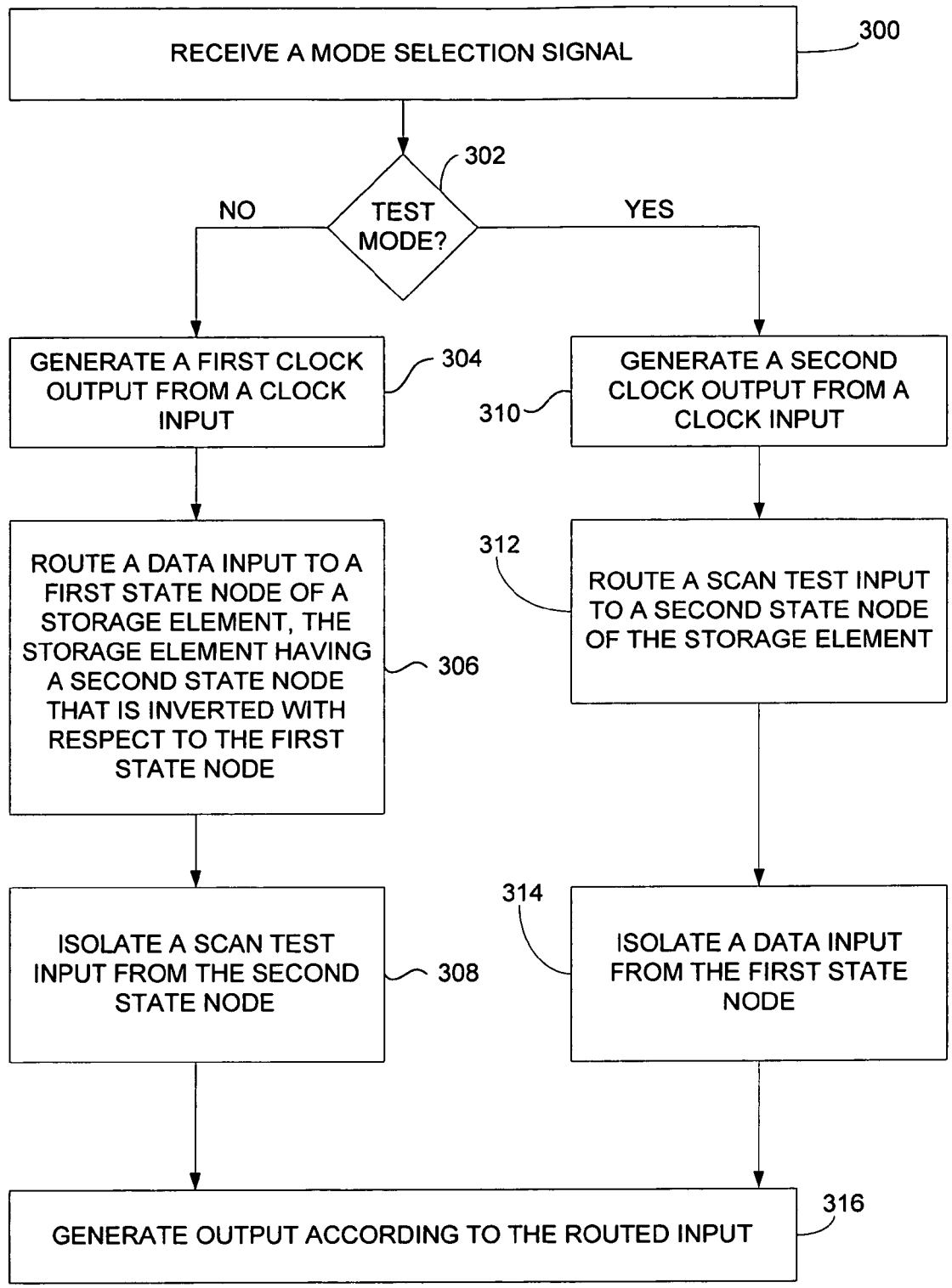
FIG. 3 is a flow diagram of a particular embodiment of a method of operation of a digital logic device.

FIG. 3 is an illustrative block diagram of a particular embodiment of a method of operation of a logic device. A mode selection signal is received (block 300). If the mode selection signal is not related to a test mode (block 302), a first clock output is generated from a clock input (block 304). A data input is routed to a first state node of a storage element, where the storage element includes a second state node that is inverted with respect to the first state node (block 306). In the operating mode, a scan test input is isolated from the second state node (block 308).

If the mode selection signal is related to a test mode (block 302), a second clock output is generated from a clock input (block 310). A scan test input is routed to a second state node of the storage element (block 312). In the scan test mode, the data input is isolated from the first state node (block 314). The output may be generated according to the routed input (block 316) (i.e. the data output in the normal operating mode or the scan test output during the scan test mode).

In one particular embodiment, a control input is received to select the test mode of operation. In one embodiment, the test mode of operation is a scan test mode. In one particular embodiment, the scan test input is routed by enabling a tri-state inverter or a transmission gate to couple the scan test input to the second state node, where the tri-state inverter or transmission gate may include a data input coupled to the scan test input, a control input coupled to a control terminal, and an output coupled to the second state node.

In one embodiment, the data input may be isolated from the first state node by disabling a second transmission gate or tri-state element. The second transmission gate or tri-state element may include a data input terminal coupled to the data input, a first control input and a second control input coupled to the control terminal, and an output coupled to the first state node, where the control terminal is inverted with respect to the first control input and the second control input.

In another particular embodiment, the data input is routed to the first state node by enabling a transmission gate to couple the data input to the first state node. In yet another particular embodiment, the scan test input may be isolated by disabling an inverter, where the inverter includes a data input coupled to the scan test input, includes a control input coupled to a control terminal, and includes an output coupled to the second state node.

In one particular embodiment, the scan test input is routed by enabling an inverter (such as the tri-state inverter 218 in FIG. 2) to couple the scan test input to the second state node. The inverter may couple the scan test input to the second state node during a test mode of operation and may isolate the second state node from the scan test input during an operating (non-test) mode. A transmission gate may couple the data input to the first state node during an operating mode and may isolate the data input from the first state node during a test mode.

In another particular embodiment, the data input is routed to the first state node by enabling a transmission gate (such as the transmission gate 254) to couple the data input to the first state node. The transmission gate may include a data input terminal coupled to the data input, a first control input and a second control input coupled to the control terminal, and an output coupled to the first state node (such as input 253, control inputs 251 and 257, and the output coupled to the first state node 258 in FIG. 2). It should be apparent to anyone skilled in the art that input inverter 252 of FIG. 2 could be replaced by another logic gate, or completely removed. It should also be apparent that tristate inverter 234 or tristate inverter 236 can be replaced by another tristate logic gate to implement an asynchronous set or reset function for the master latch. Similarly, an asynchronous set or reset function can be implemented in the slave latch by replacing inverter 280 or tristate inverter 282 by another logic gate, such as a NAND or NORpwd, or tristate logic gate, respectively.

In another particular embodiment, the scan test input may be isolated by disabling an inverter (such as the tri-state inverter 218 in FIG. 2). The inverter may include a data input coupled to the scan test input, a control input coupled to a control terminal, and an output coupled to the second state node.

Figure 4:
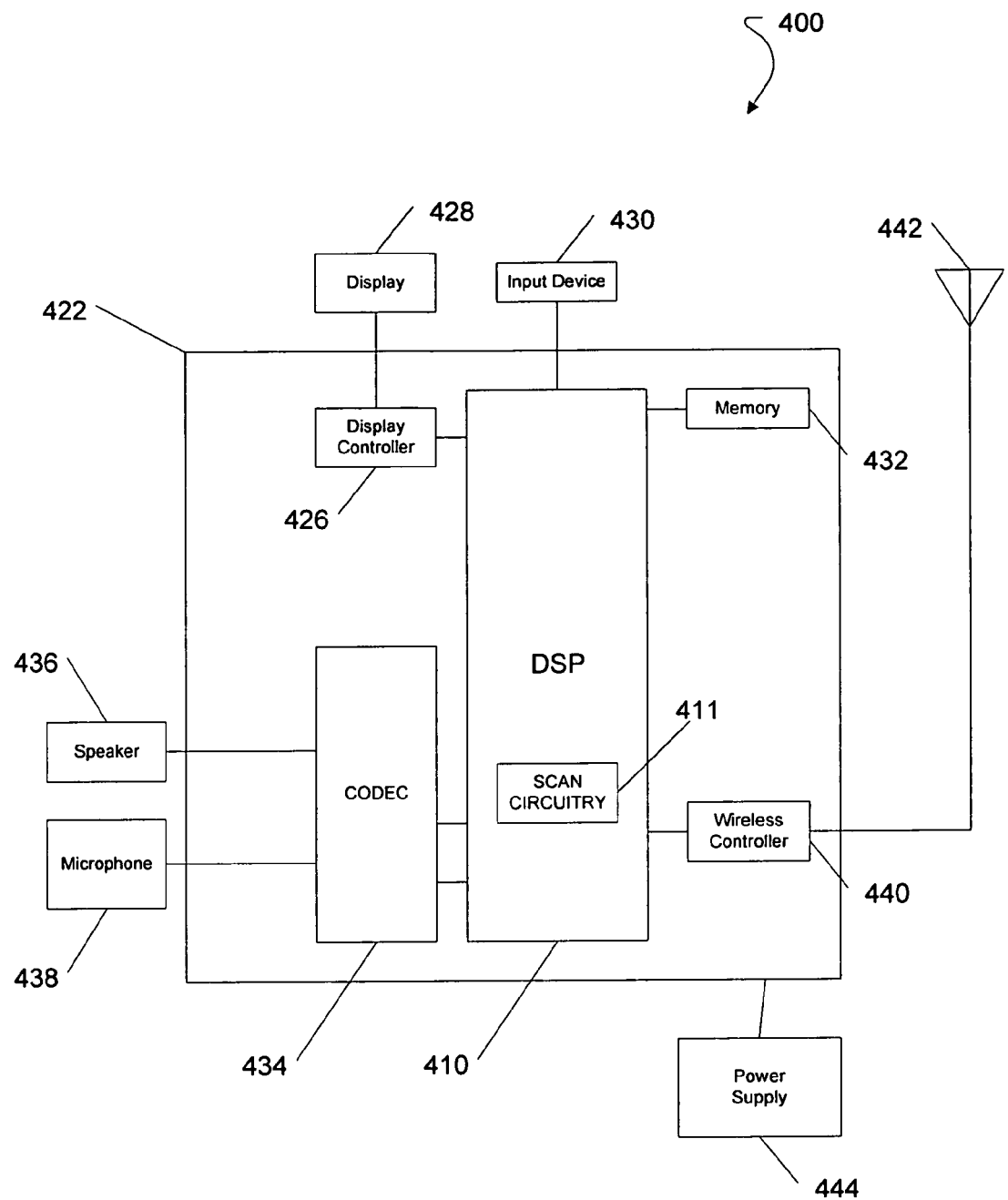
FIG. 4 is a general diagram of a portable communication device incorporating a digital signal processor in which the logic device test features and method of FIGS. 1-3 may be used.

FIG. 4 illustrates an exemplary, non-limiting embodiment of a portable communication device that is generally designated 400. As illustrated in FIG. 4, the portable communication device includes an on-chip system 422 that includes a digital signal processor 410. In a particular embodiment, the digital signal processor 410 may include scan circuitry 411 (or scan test circuitry) as described with respect to FIGS. 1-3. FIG. 4 also shows a display controller 426 that is coupled to the digital signal processor 410 and to a display 428. Moreover, an input device 430 is coupled to the digital signal processor 410. As shown, a memory 432 is coupled to the digital signal processor 410. Additionally, a coder/decoder (CODEC) 434 can be coupled to the digital signal processor 410. A speaker 436 and a microphone 438 can be coupled to the CODEC 434.

FIG. 4 also indicates that a wireless controller 440 can be coupled to the digital signal processor 410 and a wireless antenna 442. In a particular embodiment, a power supply 444 is coupled to the on-chip system 422. Moreover, in a particular embodiment, as illustrated in FIG. 4, the display 428, the input device 430, the speaker 436, the microphone 438, the wireless antenna 442, and the power supply 444 are external to the on-chip system 422. However, each is coupled to a component of the on-chip system 422.

It should be understood that while the scan circuitry 411 is shown only within the digital signal processor 410, the scan circuitry 411 may be provided in other components, including the display controller 426, the wireless controller 440, the CODEC 434, or any other component that includes a flip-flop for which design for testability (DFT) compatibility is desired. It should be understood that at least one scan test pin and at least one mode selection pin may be provided in each such component to receive scan data and to select between an operating mode and a test mode.

Figure 5:
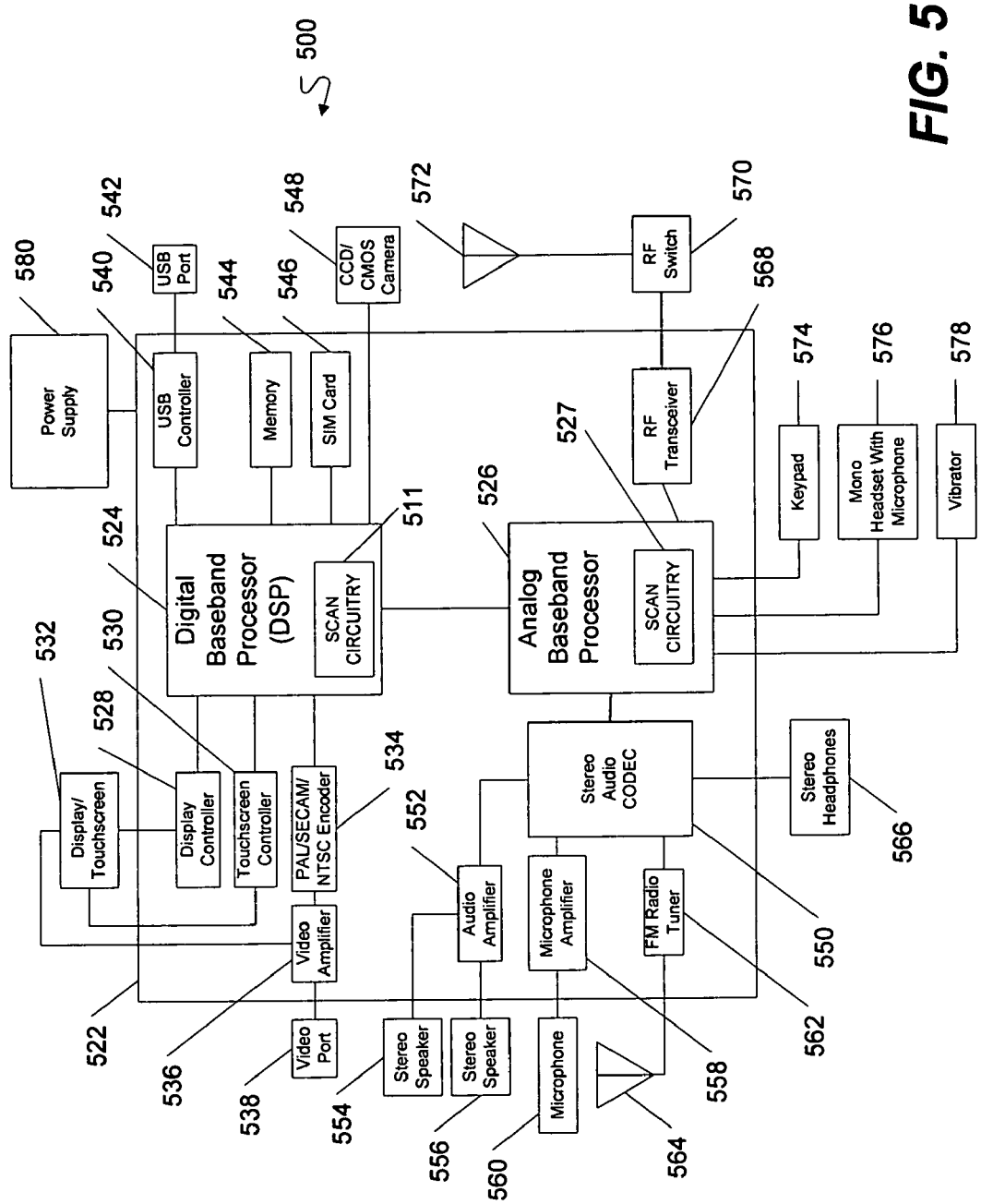
FIG. 5 is a general diagram of an exemplary cellular telephone incorporating a digital signal processor in which the digital logic device test features and method of FIGS. 1-3 may be used.

Referring to FIG. 5, an exemplary, non-limiting embodiment of a cellular telephone is shown and is generally designated 500. As shown, the cellular telephone 500 includes an on-chip system 522 that includes a digital baseband processor 524 and an analog baseband processor 526 that are coupled together. The digital baseband processor 524 may include scan circuitry 511, as described with respect to FIGS. 1-3. The analog baseband processor 526 may also include scan circuitry 527, as described with respect to FIGS. 1-3. As illustrated in FIG. 5, a display controller 528 and a touchscreen controller 530 are coupled to the digital baseband processor 524. In turn, a touchscreen display 532 external to the on-chip system 522 is coupled to the display controller 528 and the touchscreen controller 530.

FIG. 5 further indicates that a video encoder 534, e.g., a phase alternating line (PAL) encoder, a sequential couleur a memoire (SECAM) encoder, or a national television system(s) committee (NTSC) encoder, is coupled to the digital baseband processor 524. Further, a video amplifier 536 is coupled to the video encoder 534 and the touchscreen display 532. Also, a video port 538 is coupled to the video amplifier 536. As depicted in FIG. 5, a universal serial bus (USB) controller 540 is coupled to the digital baseband processor 524. Also, a USB port 542 is coupled to the USB controller 540. A memory 544 and a subscriber identity module (SIM) card 546 can also be coupled to the digital baseband processor 524. Further, as shown in FIG. 5, a digital camera 548 can be coupled to the digital baseband processor 524. In an exemplary embodiment, the digital camera 548 is a charge-coupled device (CCD) camera or a complementary metal-oxide semiconductor (CMOS) camera.

As further illustrated in FIG. 5, a stereo audio CODEC 550 can be coupled to the analog baseband processor 526. Moreover, an audio amplifier 552 can coupled to the stereo audio CODEC 550. In an exemplary embodiment, a first stereo speaker 554 and a second stereo speaker 556 are coupled to the audio amplifier 552. FIG. 5 shows that a microphone amplifier 558 can be also coupled to the stereo audio CODEC 550. Additionally, a microphone 560 can be coupled to the microphone amplifier 558. In a particular embodiment, a frequency modulation (FM) radio tuner 562 can be coupled to the stereo audio CODEC 550. Also, an FM antenna 564 is coupled to the FM radio tuner 562. Further, stereo headphones 566 can be coupled to the stereo audio CODEC 550.

FIG. 5 further indicates that a radio frequency (RF) transceiver 568 can be coupled to the analog baseband processor 526. An RF switch 570 can be coupled to the RF transceiver 568 and to an RF antenna 572. As shown in FIG. 5, a keypad 574 can be coupled to the analog baseband processor 526. Also, a mono headset with a microphone 576 can be coupled to the analog baseband processor 526. Further, a vibrator device 578 can be coupled to the analog baseband processor 526. FIG. 5 also shows that a power supply 580 can be coupled to the on-chip system 522. In a particular embodiment, the power supply 580 is a direct current (DC) power supply that provides power to the various components of the cellular telephone 500 that require power. Further, in a particular embodiment, the power supply is a rechargeable DC battery or a DC power supply that is derived from an alternating current (AC) to DC transformer that is connected to an AC power source.

In a particular embodiment, as depicted in FIG. 5, the touchscreen display 532, the video port 538, the USB port 542, the camera 548, the first stereo speaker 554, the second stereo speaker 556, the microphone 560, the FM antenna 564, the stereo headphones 566, the RF switch 570, the RF antenna 572, the keypad 574, the mono headset 576, the vibrator device 578, and the power supply 580 are external to the on-chip system 522.

It should be understood that while the scan circuitry 511 and 527 is shown only within the digital signal processor 524 and within the analog baseband processor 526, scan circuitry, such as that described with respect to FIGS. 1-3, may be provided in other components, including the display controller 528, the touchscreen controller 530, the PAL/SECAM/NTSC encoder 534, or any other component that includes a flip-flop for which design for testability (DFT) compatibility is desired. It should be understood that at least one scan test pin and at least one mode selection pin may be provided in each such component to receive scan data and to select between an operating mode and a test mode.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A device comprising:
a data input;
a scan test input;
a clock demultiplexer responsive to a clock input to selectively provide a first clock output and a second clock output, wherein the clock demultiplexer comprises a first logic gate and a second logic gate, and wherein when a mode selection signal is at a logic low level, the first logic gate provides a logical zero output and the second logic gate provides a clock signal that is inverted relative to the clock input;
a master latch coupled to the data input and to the scan test input, the master latch including a pair of cross-coupled inverters and a master latch output, the master latch responsive to the first clock output to couple the data input to the master latch output and responsive to the second clock output to couple the scan test input to the master latch output, wherein a first input of a first inverter of the pair of cross-coupled inverters is coupled to the data input and wherein a second input of a second inverter of the pair of cross-coupled inverters is coupled to the scan test input; and
a slave latch responsive to the clock input and independent of the first clock output and the second clock output, wherein the slave latch is responsive to the master latch output.

2. The device of claim 1, wherein the first logic gate is a first NOR gate and the second logic gate is a second NOR gate, wherein the first NOR gate is configured to receive the clock input and the mode selection signal and to generate the first clock output, and wherein the second NOR gate is configured to receive the mode selection signal and to generate the second clock output.

3. The device of claim 1, wherein the master latch is further responsive to the second clock output to electrically isolate the data input from the master latch output using a pass gate, the pass gate comprising a tri-state device.

4. A method of operation of a digital logic device, the method comprising:
receiving a mode selection signal to select one of an operating mode and a test mode at a clock demultiplexer, wherein the clock demultiplexer comprises a first NOR gate and a second NOR gate, and wherein when the mode selection signal is at a logic low level, the first NOR gate provides a logical zero output and the second NOR gate provides a clock signal that is inverted relative to a clock input;
receiving a first clock at a data latch when the operating mode is selected and receiving a second clock at the data latch when the test mode is selected, wherein the data latch includes cross-coupled inverters coupled between a first state node and a second state node;
routing a data input to the first state node of the data latch in response to receiving the first clock;
isolating a scan test input from the second state node of the data latch when the data input is routed to the first state node; and
receiving an output of the data latch at a slave latch, wherein the slave latch is responsive to a source clock.

5. The method of claim 4, further comprising routing the scan test input to the second state node by enabling a first gating element comprising a first tri-state inverter or a first transmission gate to couple the scan test input to the second state node, the first gating element comprising:
   a first gating element input coupled to the scan test input;
   a first gating element control input; and
   a first gating element output coupled to the second state node.

6. The method of claim 4, wherein routing the data input to the first state node comprises enabling a transmission gate to couple the data input to the first state node.

7. The method of claim 4, wherein isolating the scan test input comprises disabling an inverter, wherein the inverter comprises:
   an inverter data input coupled to the scan test input;
   an inverter control input; and
   an inverter output coupled to the second state node.

8. An apparatus comprising:
   a clock demultiplexer coupled to a clock input and responsive to a mode selection signal to selectively generate a first clock or a second clock, wherein the clock demultiplexer comprises a first NOR gate and a second NOR gate, and wherein when the mode selection signal is at a logic low level, the first NOR gate provides a logical zero output and the second NOR gate provides a clock signal that is inverted relative to the clock input;
   a master latch coupled to a data input and a scan test input and including a master latch output, the master latch responsive to the first clock to couple the data input to the master latch output and responsive to the second clock to couple the scan test input to the master latch output, wherein when the data input is coupled to the master latch output the scan test input is electrically isolated from the master latch output, wherein the data input is coupled to a first input of a pair of cross-coupled inverters and the scan test input is coupled to a second input of the pair of cross-coupled inverters; and
   a slave latch responsive to the clock input and independent of the first clock and the second clock, wherein the slave latch is responsive to the master latch output.

9. The apparatus of claim 8, wherein the mode selection signal includes one of a test scan mode and an operating mode, and wherein an output of the slave latch is provided to a scan test output when the mode selection signal is the test scan mode and wherein the output of the slave latch is not provided to the scan test output when the mode selection signal is the operating mode.

10. The apparatus of claim 8, wherein the master latch comprises:
   scan test circuitry to receive the scan test input and responsive to the mode selection signal to couple the scan test input to the second input of the pair of cross-coupled inverters, and
   wherein the pair of cross-coupled inverters comprises a first tri-state inverter cross-coupled with a second tri-state inverter, wherein the first tri-state inverter includes a scan test clock input responsive to the first clock, an inverted input to receive an activation signal, the first input coupled to a first state node, and an output coupled to a second state node, wherein the second tri-state inverter includes the second input coupled to the second state node, a clock input responsive to the second clock, and an output that is coupled to the first state node.

11. The apparatus of claim 9, wherein the scan test output is gated according to the mode selection signal.

12. The apparatus of claim 10, wherein the slave latch includes a tri-state device.

13. The apparatus of claim 8, wherein the master latch comprises a memory element including the pair of cross-coupled inverters and a write circuit, wherein the write circuit comprises a transmission gate.

14. An apparatus comprising:
   a scan test input to receive scan test data;
   a mode selection input comprising hardware to receive each and every of a first mode selection signal and a second mode selection signal at a data latch coupled to a slave latch, the slave latch responsive to a source clock, wherein the slave latch provides a data output and a scan test output, and wherein the scan test output is gated according to the second mode selection signal; and
   a clock demultiplexer coupled to the source clock and responsive to the mode selection input to selectively generate a first clock or a second clock, wherein the clock demultiplexer comprises a first NOR gate and a second NOR gate, and wherein when the mode selection input is at a logic low level, the first NOR gate provides a logical zero output and the second NOR gate provides a clock signal that is inverted relative to the source clock.

15. The apparatus of claim 14, wherein the second mode selection signal comprises a test mode indicator.

16. The apparatus of claim 14, wherein a data input is coupled to a first input of a pair of cross-coupled inverters and wherein the scan test input is coupled to a second input of the pair of cross-coupled inverters.

17. An apparatus comprising:
   means for selectively providing one of:
      a first output to an output of a data latch in a first mode of operation, the first output associated with data received from a data input; and
      a second output to the output of the data latch in a second mode of operation, the second output associated with scan test information received from a scan test input;
      wherein the means for selectively providing one of the first output and the second output includes a clock demultiplexer coupled to a source clock and responsive to a mode selection signal to selectively provide a first clock or a second clock, wherein the clock demultiplexer comprises a first NOR gate and a second NOR gate, and wherein when the mode selection signal is at a logic low level, the first NOR gate provides a logical zero output and the second NOR gate provides a clock signal that is inverted relative to the source clock; and
   means for generating a data output from the first output and for generating a scan test output from the second output, wherein the scan test output is gated according to the mode selection signal.

18. An apparatus comprising:
   a data latch including a first state node and a second state node;
   a slave latch responsive to an output of the data latch, wherein the slave latch provides a data output and a scan test output, and wherein the scan test output is gated according to a mode selection signal;
   a clock demultiplexer to receive a clock input, the clock demultiplexer responsive to the mode selection signal to selectively produce one of a first clock output and a second clock output, wherein the clock demultiplexer comprises a first NOR gate and a second NOR gate, and wherein when the mode selection signal is at a logic low level, the first NOR gate provides a logical zero output and the second NOR gate provides a clock signal that is inverted relative to the clock input, and wherein the slave latch is responsive to the clock input and independent of the first clock output and the second clock output;

a transmission gate to receive a data input, the transmission gate comprising a first tri-state device that is responsive to the first clock output to couple the data input to the first state node; and scan test circuitry to receive a scan test input, the scan test circuitry comprising a second tri-state device that is responsive to the second clock output to couple the scan test input to the second state node;

wherein, when the scan test input is coupled to the second state node, the data input is electrically isolated from the first state node.

19. The apparatus of claim 18, wherein, when in a first mode of operation, the scan test circuitry is gated in a power off state.

20. The apparatus of claim 18, wherein the data latch comprises a memory element including a pair of cross-coupled inverters, wherein the data input is coupled to a first input of the pair of cross-coupled inverters and wherein the scan test input is coupled to a second input of the pair of cross-coupled inverter.

21. The device of claim 1, wherein the master latch is responsive to the second clock output to couple the scan test input to the master latch output and to electrically isolate the data input from the master latch output.

22. The device of claim 1, wherein the master latch is responsive to the first clock output to electrically isolate the scan test input from the master latch output.

23. The method of claim 5, wherein the data input is isolated from the first state node by disabling a second gating element comprising a second transmission gate or a second tri-state element, the second gating element comprising:
a second gating element input terminal coupled to the data input;
a first control input of the second gating element;
a second control input of the second gating element; and
a second gating element output coupled to the first state node.

24. The apparatus of claim 8, wherein whenever the scan test input is coupled to the master latch output the data input is electrically isolated from the master latch output.

25. The apparatus of claim 14, wherein when the second mode selection signal is received:
the scan test output is to provide scan test output data that is related to the received scan test input; and
the data output is electrically isolated from the data input.

26. The device of claim 1, wherein the scan test output is gated according to the mode selection signal.

27. The method of claim 4, wherein the scan test output is gated according to the mode selection signal.

28. The apparatus of claim 17, wherein the data input is coupled to a first input of a pair of cross-coupled inverters and wherein the scan test input is coupled to a second input of the pair of cross-coupled inverters.

29. The device of claim 1, wherein the clock demultiplexer includes at least one clock path and wherein the clock demultiplexer has fewer than three gate delays on the at least one clock path.

* * * * *